(12) United States Patent
Chang et al.

(10) Patent No.: US 9,412,597 B2
(45) Date of Patent: Aug. 9, 2016

(54) FLASH MEMORY SEMICONDUCTOR DEVICE AND METHOD THEREOF

(71) Applicant: TAIWAN SEMICONDUCTOR MANUFACTURING CO., LTD., Hsinchu (TW)

(72) Inventors: Jen-Yuan Chang, Hsinchu (TW); Chia-Ping Lai, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/098,009

(22) Filed: Dec. 5, 2013

(65) Prior Publication Data

US 2015/0162412 A1 Jun. 11, 2015

(51) Int. Cl.
| | | |
|---|---|---|
| *H01L 29/423* | (2006.01) | |
| *H01L 21/28* | (2006.01) | |
| *H01L 27/115* | (2006.01) | |
| *H01L 29/66* | (2006.01) | |
| *H01L 29/792* | (2006.01) | |

(52) U.S. Cl.
CPC .... *H01L 21/28273* (2013.01); *H01L 21/28282* (2013.01); *H01L 27/11565* (2013.01); *H01L 27/11568* (2013.01); *H01L 29/4234* (2013.01); *H01L 29/66833* (2013.01); *H01L 29/792* (2013.01)

(58) Field of Classification Search
None
See application file for complete search history.

(56) References Cited

U.S. PATENT DOCUMENTS

| | | |
|---|---|---|
| 8,344,444 B2 | 1/2013 | Kawashima et al. |
| 2005/0085039 A1 | 4/2005 | Yasui et al. |
| 2010/0065900 A1 | 3/2010 | Murata et al. |
| 2011/0095348 A1* | 4/2011 | Chakihara ......... H01L 21/28273 257/298 |

FOREIGN PATENT DOCUMENTS

| | | |
|---|---|---|
| KR | 10-2010-0032331 A | 3/2010 |
| TW | 200605079 | 2/2006 |

* cited by examiner

*Primary Examiner* — Robert Carpenter
(74) *Attorney, Agent, or Firm* — McDermott Will & Emery LLP

(57) ABSTRACT

The present disclosure provides a method of fabricating a flash memory semiconductor device. In one embodiment, a method of fabricating a resistive memory array includes providing a semiconductor substrate having at least one memory cell array region and at least one shunt region, forming a control gate electrode on the memory cell array region and the shunt region, depositing a dielectric film lamination and a conductive film to cover the control gate electrode and the semiconductor substrate, forming two recesses respectively corresponding to two sides of the control gate electrode on the shunt region, patterning the conductive film to form two sidewall memory gate electrodes and one top memory gate electrode, removing one of the sidewall memory gate electrodes on the memory cell array region, and removing the dielectric film lamination which is exposed from the memory gate electrodes.

20 Claims, 13 Drawing Sheets

FLASH MEMORY SEMICONDUCTOR DEVICE AND METHOD THEREOF

BACKGROUND

Memory semiconductor devices for storing data may be classified into volatile memory semiconductor devices and non-volatile memory semiconductor devices. The volatile memory semiconductor devices are typically configured to store data by charging or discharging capacitors in memory cells, and widely applied as main memories of various electronic apparatus in operation. However, the application of the volatile memory semiconductor devices is limited because the volatile memory semiconductor devices lose the stored data in the absence of power supply.

In this regard, the non-volatile memory semiconductor devices, such as flash memory semiconductor devices, have attracted the attention of many researchers. In particular, the flash memory semiconductor devices with a structure of split gates, a control gate and a memory gate, have been studied in variety of researches. The control gate selects a specific memory cell in the memory cell array. And the memory gate of the selected memory cell performs the write, erase, and read operations on the selected memory cell.

In continuous development of integrated circuit technology, the flash memory semiconductor devices with a structure of split gates confront many issues and technology difficulties in scaling-down. Among these issues and difficulties, the reliability and the uniformity defects of each memory cell are most important to be addressed. While the flash memory semiconductor device is fabricated in a scaling-down size, the reliability and uniformity may suffer serious decrease. Accordingly, improvements in methods of fabricating a flash memory semiconductor device continue to be sought.

BRIEF DESCRIPTION OF THE DRAWINGS

Embodiments of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

The singular forms "a", "an" and "the" used herein include plural referents unless the context clearly dictates otherwise. Reference throughout this specification to "one embodiment" or "an embodiment" means that a particular feature, structure, or characteristic described in connection with the embodiment is included in at least one embodiment of the present disclosure. Therefore, the appearances of the phrases "in one embodiment" or "in an embodiment" in various places throughout this specification are not necessarily all referring to the same embodiment. Further, the particular features, structures, or characteristics may be combined in any suitable manner in one or more embodiments. It should be appreciated that the following figures are not drawn to scale; rather, these figures are intended for illustration.

Conventionally, a memory gate on a memory cell array region and a shunt region of a semiconductor substrate is fabricated by the same step during fabricating a flash memory semiconductor device. Therefore, a common height of the memory gate electrode on both of the memory cell array region and the shunt region of the semiconductor substrate is formed. However, if the common height of the memory gate electrode is predetermined long, the risk of current-leakage problem will be increase. On the other hand, when the common height of the memory gate electrode is predetermined short enough to avoid current-leakage risk, process charging issue may occur and worsen the uniformity of the threshold voltage of the memory gate electrodes within wafer. In this regard, a method of fabricating a flash memory semiconductor device is provided according to various embodiments of the present disclosure.

Figure 1:
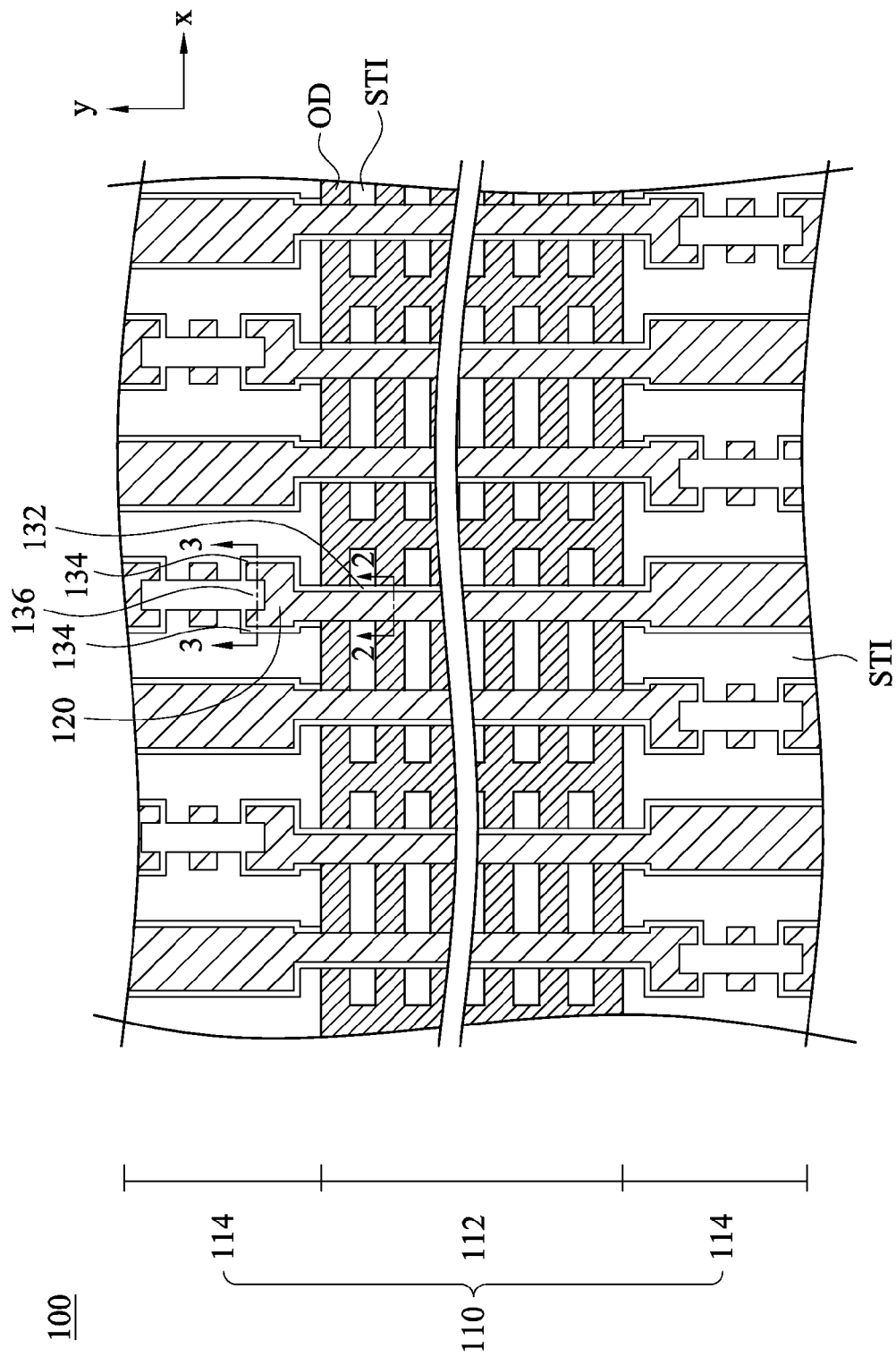
FIG. 1 illustrates schematic top-view of a portion of a flash memory semiconductor device according to various embodiments of the present disclosure.
Figure 2:
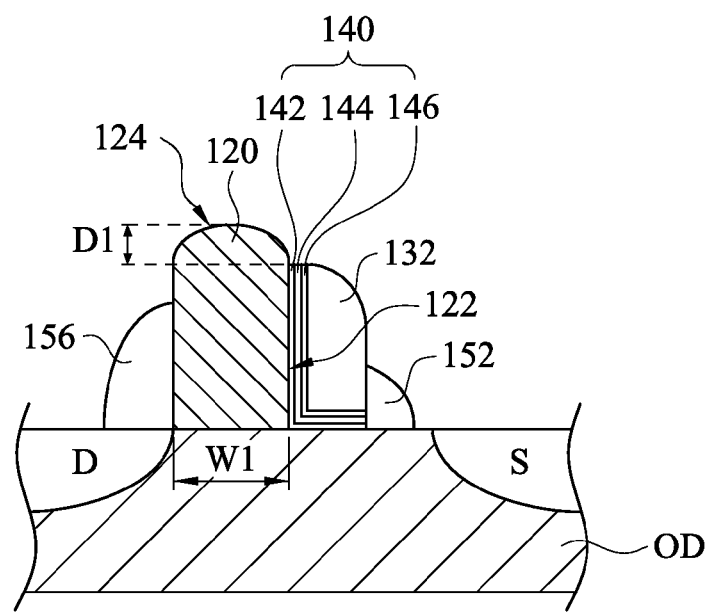
FIG. 2 is a cross-section view cut along 2-2 line illustrated in FIG. 1.
Figure 3:
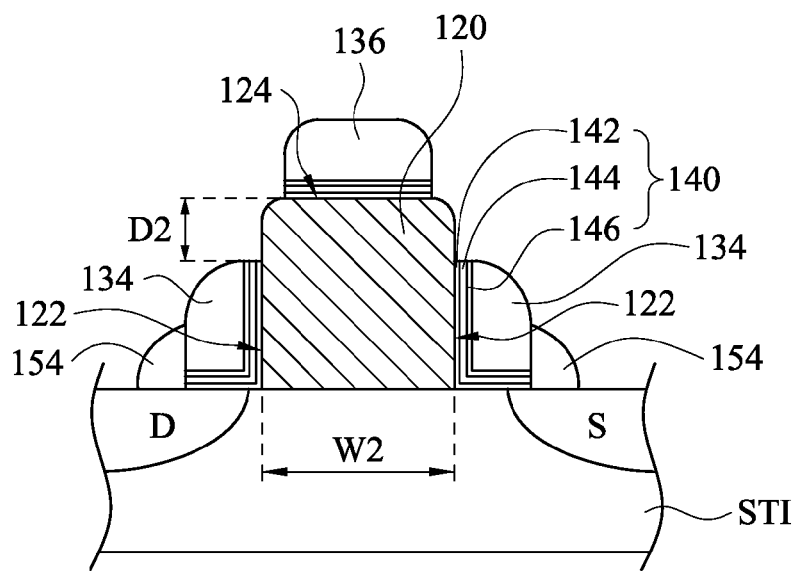
FIG. 3 is a cross-section view cut along 3-3 line illustrated in FIG. 1.

FIG. 1 illustrates schematic top-view of a portion of a flash memory semiconductor device according to various embodiments of the present disclosure; FIG. 2 is a cross-section view cut along 2-2 line illustrated in FIG. 1; and FIG. 3 is a cross-section view cut along 3-3 line illustrated in FIG. 1. Referring to FIG. 1-3, a flash memory semiconductor device 100 includes a semiconductor substrate 110, a control gate electrode 120, a cell memory gate electrode 132, two shunt sidewall memory gate electrodes 134, a top memory gate electrode 136, and a plurality of dielectric film laminations 140. The semiconductor substrate 110 has at least one memory cell array region 112 and at least one shunt region 114. The shunt region 114 is adjacent to the memory cell array region 112. As illustrated in FIG. 1, for example, two shunt regions 114 and one memory cell array region 112 are alternatively arranged along a y-axis direction, and the memory cell array region 112 is sandwiched by the shunt regions 114. The memory cell array region 112 is a region in which memory cells are formed in an array and the shunt regions 114 are regions used to supply a voltage to the memory cell array region 112. In a flash memory semiconductor device, it is necessary to apply a predetermined voltage to the memory cell at the time of write, erase, and read operations. Therefore, the shunt region 114 is provided in order to supply a predetermined voltage to the memory cell in the memory cell array region 112 when performing aforementioned operations. In the memory cell array region 112, an oxide defined OD of the semiconductor substrate 110 is surrounded by isolation STI of the semiconductor substrate 110, and a plurality of memory cells is defined. On the other hand, the isolation STI in the shunt region 114 of the semiconductor substrate 110 is formed, for example, at the same level with oxide defined OD and the isolation STI in the memory cell array region 112.

Also shown in FIG. 1, the control gate electrode 120 is disposed on the memory cell array region 112 and the shunt region 114. The control gate electrode 120 may extend along the y-axis direction, and is formed on both of on the memory cell array region 112 and the shunt region 114. The control gate electrode 120 has a function to select a specific memory cell in the memory cell array region 112. That is, the specific memory cell in the memory cell array region 112 is selected by the control gate electrode 120 and the write, the erase, and the read operations are performed on the selected memory cell. In various embodiments of the present disclosure, the control gate electrode 120 includes polysilicon. A silicide film, such as cobalt silicide, nickel silicide, or platinum silicide film may be further formed on the control gate electrode 120 for reducing the resistance of the control gate electrode 120.

Referring to FIG. 1 and FIG. 2, the cell memory gate electrode 132 is disposed at one sidewall 122 of the control gate electrode 120 on the memory cell array region 112. As illustrated in FIG. 3, the cell memory gate electrode 132 may be sidewall shape formed on one sidewall 122 of the control gate electrode 120. The cell memory gate electrode 132 is the gate electrode for controlling the write, erase, and read operations on the selected memory cell. In various embodiments of the present disclosure, the shunt sidewall memory gate electrodes 134 and the top memory gate electrode are made of polysilicon or doped-polysilicon. Similar to the control gate electrode 120, a silicide film, such as cobalt silicide, nickel silicide, or platinum silicide film may be further formed on the cell memory gate electrode 132 for reducing the resistance of the cell memory gate electrode 132.

Referring to FIG. 1 and FIG. 3, two shunt sidewall memory gate electrodes 134 are respectively disposed at two sidewalls 122 of the control gate electrode 120 on the shunt region 114. And the top memory gate 136 is disposed on a top surface 124 of the control gate electrode 120 on the shunt region 114. As illustrated in FIG. 3, the shunt sidewall memory gate electrodes 134 may also be sidewall shape respectively formed on at two sidewalls 122 of the control gate electrode 120. In various embodiments of the present disclosure, the cell memory gate electrode 132 is made of polysilicon or doped-polysilicon. Similar to the control gate electrode 120, a silicide film, such as cobalt silicide, nickel silicide, or platinum silicide film may be further formed on the shunt sidewall memory gate electrodes 134 and the top memory gate electrode 136 for reducing the resistance of them respectively. The current signals/voltage of cell memory gate electrode 132 may be inputted from the shunt sidewall memory gate electrode 134 by electrically connecting. In various embodiments of the present disclosure, one of the shunt sidewall memory gate electrodes 134 is electrically connected to the cell memory gate electrode 132.

Referring to FIG. 2 and FIG. 3, a plurality of dielectric film laminations 140 is disposed between the control gate electrode 120 and the cell memory gate electrode 132, the shunt sidewall memory gate electrodes 134, and the top memory gate 136 respectively. In other words, dielectric film laminations 140 are respectively sandwiched between the control gate electrode 120 and the cell memory gate electrode 132, the control gate electrode 120 and the shunt sidewall memory gate electrodes 134, and the control gate electrode 120 and the top memory gate electrode 136. The dielectric film lamination 140 has a trap level at which charges can be stored. A non-volatile memory semiconductor device having the dielectric film lamination 140 is operated as a memory element by injecting/discharging charges into/from the dielectric film lamination 140 to shift the threshold value of the MOS transistors as illustrated in FIG. 2 and FIG. 3. A non-volatile memory semiconductor device having such a trap insulating film as a charge storage film is generally called a MONOS (Metal Oxide Nitride Oxide Semiconductor) transistor. The MONOS transistor has excellent reliability of data holding compared to the case where a conductive floating gate electrode is used as a charge storage film because charges are stored at discrete trap levels. In various embodiments of the present disclosure, the dielectric film lamination 140 includes a first silicon oxide film 142, a silicon nitride film 144, and a second silicon nitride film 146. The first silicon oxide film 142 is disposed over the control gate electrode 120 and the semiconductor substrate 110. The silicon nitride film 144 is disposed on the first silicon oxide film 142. The second silicon nitride film 146 disposed on the silicon nitride film 144. As shown in FIG. 3, in various embodiments of the present disclosure, the flash memory semiconductor device 100 further includes a cell sidewall spacer 152, 156. The cell sidewall spacer 152 is disposed along the cell memory gate electrode 132 for extending the distance between the source S and the drain D which are formed by implant processes or other purposes. Also as shown in FIG. 3, in various embodiments of the present disclosure, the flash memory semiconductor device 100 further includes two shunt sidewall spacers 154, 156. The shunt sidewall spacers 154 are respectively disposed along two shunt sidewall memory gate electrodes 134 for extending the distance between the source S and the drain D which are formed by implant processes or other purposes.

Figure 4:
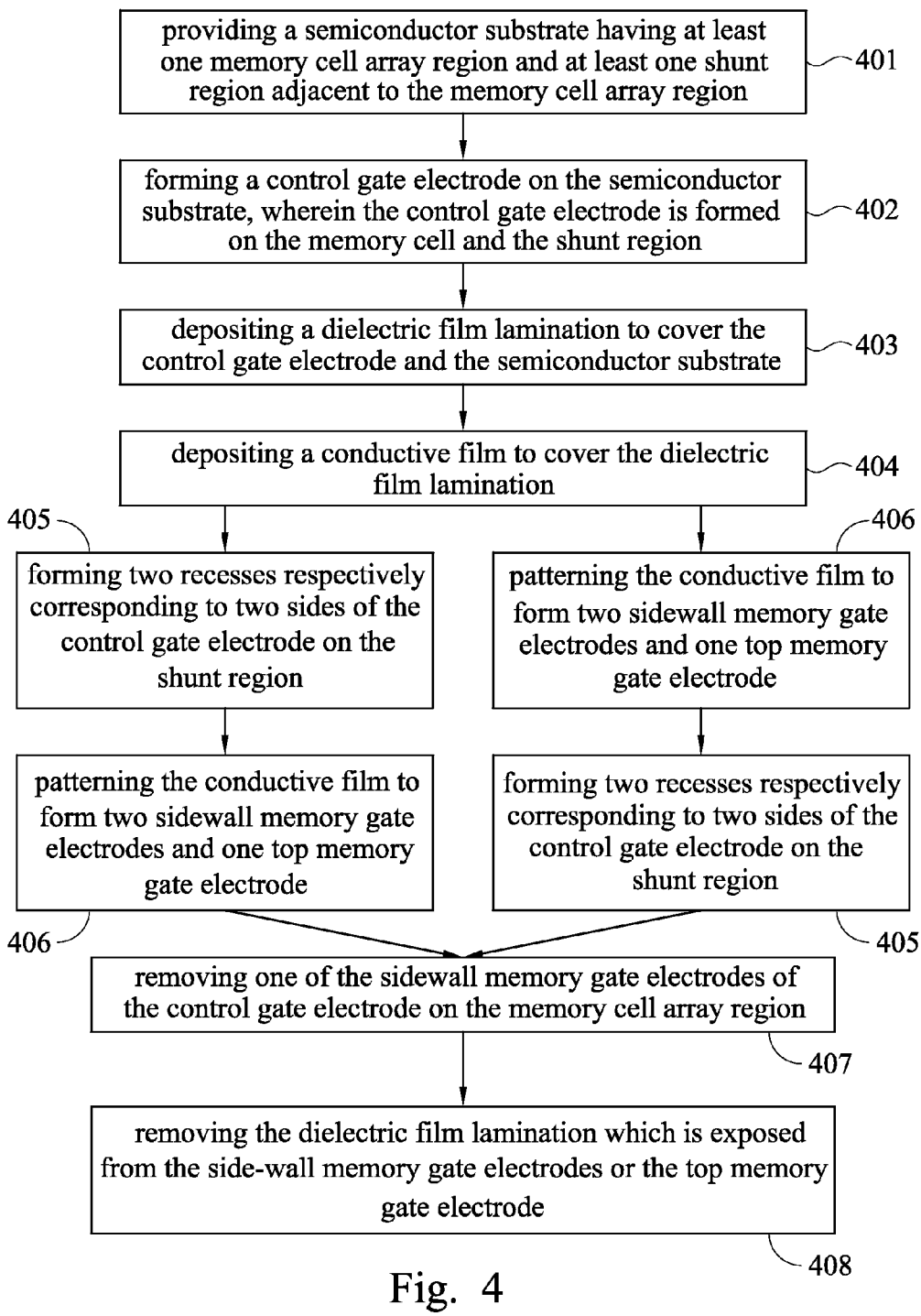
FIG. 4 is a flowchart illustrating a method of fabricating a flash memory semiconductor device according to various embodiments of the present disclosure.

As illustrated in FIG. 2 and FIG. 3, it should be noticed that the distance D2 between the top surface 124 of the control gate electrode 120 and the shunt sidewall memory gate electrode 134 is greater than the distance D1 between the top surface 124 of the control gate electrode 120 and the cell memory gate electrode 132. Generally, the distance D2 between the top surface 124 of the control gate electrode 120 and the shunt sidewall memory gate electrode 134 will be substantially equal to the distance D1 between the top surface 124 of the control gate electrode 120 and the cell memory gate electrode 132 since the distances D1 and D2 are formed in the same process. As shown in FIG. 4, when the distances D1 and D2 are predetermined relatively short, the risk of current-leakage problem occurred between the dielectric film laminations 140 respectively corresponding to the top memory gate electrode 136 and the shunt sidewall memory gate electrodes 134 will increase due to inevitable process variations. On the other hand, when the distances D1 and D2 are predetermined long enough to avoid aforementioned risk, process charging issue at the dielectric film laminations corresponding to the cell memory gate electrode 132 (as illustrated in FIG. 2) may occur and worsen the uniformity of the threshold voltage of the cell memory gate electrodes 132 within wafer. In other words, there are two issues, which are correlated to the distances D1 and D2, respectively concerned in the transistors on the memory cell array region 112 and the shunt region 114, and there is no optimized and common length of the distances D1 and D2 to avoid aforementioned issues simultaneously. Therefore, the distance D2 between the top surface 124 of the control gate electrode 120 and the shunt sidewall memory gate electrode 134 (as shown in FIG. 3) and the distance D1 between the top surface 124 of the control gate electrode 120 and the cell memory gate electrode 132 (as shown in FIG. 2) is predetermined different, and D2 is greater than D1 according to the present disclosure. In various embodiments of the present disclosure, the distance D2 between the top surface 124 of the control gate electrode 120 and the shunt sidewall memory gate electrode 134 is substantially 5-30 nm greater than the distance D1 between the top surface 124 of the control gate electrode 120 and the cell memory gate electrode 132. In various embodiments of the present disclosure, the distance D2 between the top surface 124 of the control gate electrode 120 and the shunt sidewall memory gate electrode 134 is substantially 60-75 nm, and the distance D1 between the top surface 124 of the control gate electrode 120 and the cell memory gate electrode 132 is substantially 45-55 nm. Also shown in FIG. 2 and FIG. 3, the width W2 of the control gate electrode 120 disposed on the shunt region 114 is greater than the width W1 of the control gate electrode 120 disposed on the memory cell array region 112. The details of fabricating the flash memory semiconductor devices according to various embodiments of the present disclosure are described in following paragraphs.

Referring to FIG. 4, FIG. 4 is a flowchart illustrating a method of fabricating a flash memory semiconductor device according to various embodiments of the present disclosure. The method 400 begins with block 401 in which a semiconductor substrate is provided. The semiconductor substrate has at least one memory cell region and at least one shunt region adjacent to the memory cell region. The method 400 continues with block 402 in which a control gate electrode is formed on the semiconductor substrate. The control gate electrode is formed on the memory cell array region and the shunt region. Next, the method 400 includes depositing a dielectric film lamination to cover the control gate electrode and the semiconductor substrate as shown in block 403. The method 400 continues with block 404 in which a conductive film is deposited to cover the dielectric film lamination. Next, in some embodiments of the present disclosure, the method 400 includes forming two recesses respectively corresponding to two sides of the control gate electrode on the shunt region as shown in block 405, and the method 400 continues with block 406 in which the conductive film is patterned to form two sidewall memory gate electrodes and one top memory gate electrode. The sidewall memory gate electrodes are respectively formed at two sidewalls of the control gate electrode on the memory cell array region and the shunt region, and the top memory gate electrode is formed above the control gate electrode on the shunt region. According to other some embodiments of the present disclosure, block 406, in which the conductive film is patterned to form two sidewall memory gate electrodes and one top memory gate electrode, can be performed before block 405, forming two recesses respectively corresponding to two sides of the control gate electrode on the shunt region. Next, the method 400 includes removing one of the sidewall memory gate electrodes of the control gate electrode on the memory cell array region as shown in block 407. The method 400 continues with block 408 in which the dielectric film lamination, which is exposed from the sidewall memory gate electrodes or the top memory gate electrode, is removed.

The method for fabricating a flash memory semiconductor device according to various embodiments of the present disclosure will be described in conjunction with FIG. 5-14.

Figure 5:
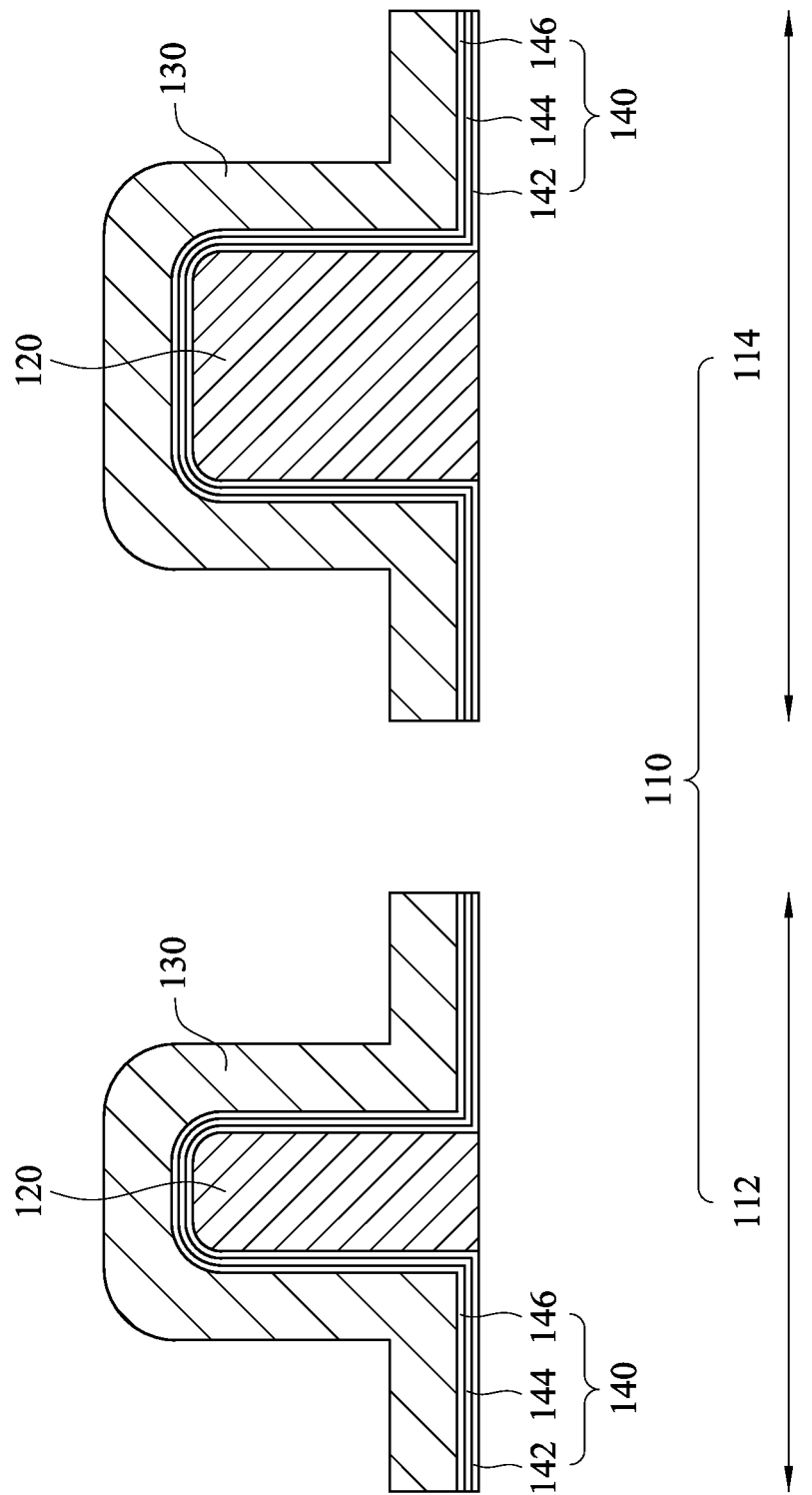
FIG. 5 is a schematic view of a portion of a flash memory semiconductor device in an intermediate stage of manufacturing according to various embodiments of the present disclosure.

Referring to FIG. 5, FIG. 5 is a schematic view of a portion of a flash memory semiconductor device in an intermediate stage of manufacturing according to various embodiments of the present disclosure. As illustrated in FIG. 5, a semiconductor substrate 110 is provided. The semiconductor substrate 110 has at least one memory cell array region 112 and at least one shunt region 114 adjacent to the memory cell array region 112. The semiconductor substrate 110 may include silicon material or alternatively may include silicon germanium, gallium arsenic, or other suitable semiconductor materials. The semiconductor substrate 110 may further include doped regions such as a P-well and/or an N-well (not shown). A control gate electrode 120 is formed on the semiconductor substrate 110. The control gate electrode 120 is formed on the memory cell array region 112 and the shunt region 114. The control gate electrode 120 may be made of any conductive materials suitable to be applied as gate electrodes. In various embodiments of the present disclosure, the control gate electrode 120 includes polysilicon. The control gate electrode 120 may be fabricated by depositing a conductive film on the memory cell array region 112 and the shunt region 114 of the semiconductor substrate 110. A photo resist mask may be formed on the conductive film to delineate where the control gate electrode 120 is desired. The conductive film is then etched with a suitable etchant. The photo resist mask is then stripped, and the control gate electrode 120 is formed as illustrated in FIG. 5.

As shown in FIG. 5, a dielectric film lamination 140 is deposited to cover the control gate electrode 120 and the semiconductor substrate 110. The dielectric film lamination 140 may be made of silicon oxide, silicon nitride, or a combination thereof, and may be formed by suitable processes, such as CVD, PVD, ALD, HDPCVD, MOCVD, RPCVD, PECVD, PLD, other suitable techniques, or combinations thereof. In various embodiments of the present disclosure, the operation of depositing the dielectric film lamination 140 includes depositing a first silicon oxide film 142 over the control gate electrode 120 and the semiconductor substrate 110, depositing a silicon nitride film 144 over the first silicon oxide film 142, and depositing a second silicon nitride film 146 over the silicon nitride film 144, and therefore the dielectric film lamination 140 is formed as illustrated in FIG. 5.

Also as shown in FIG. 5, a conductive film 130 is deposited to cover the dielectric film lamination 140. The conductive film 130 may be made of any conductive materials which are suitable to be applied as gate electrodes, and may be formed by suitable processes, such as CVD, PVD, ALD, HDPCVD, MOCVD, RPCVD, PECVD, PLD, other suitable techniques, or combinations thereof.

Figure 6:
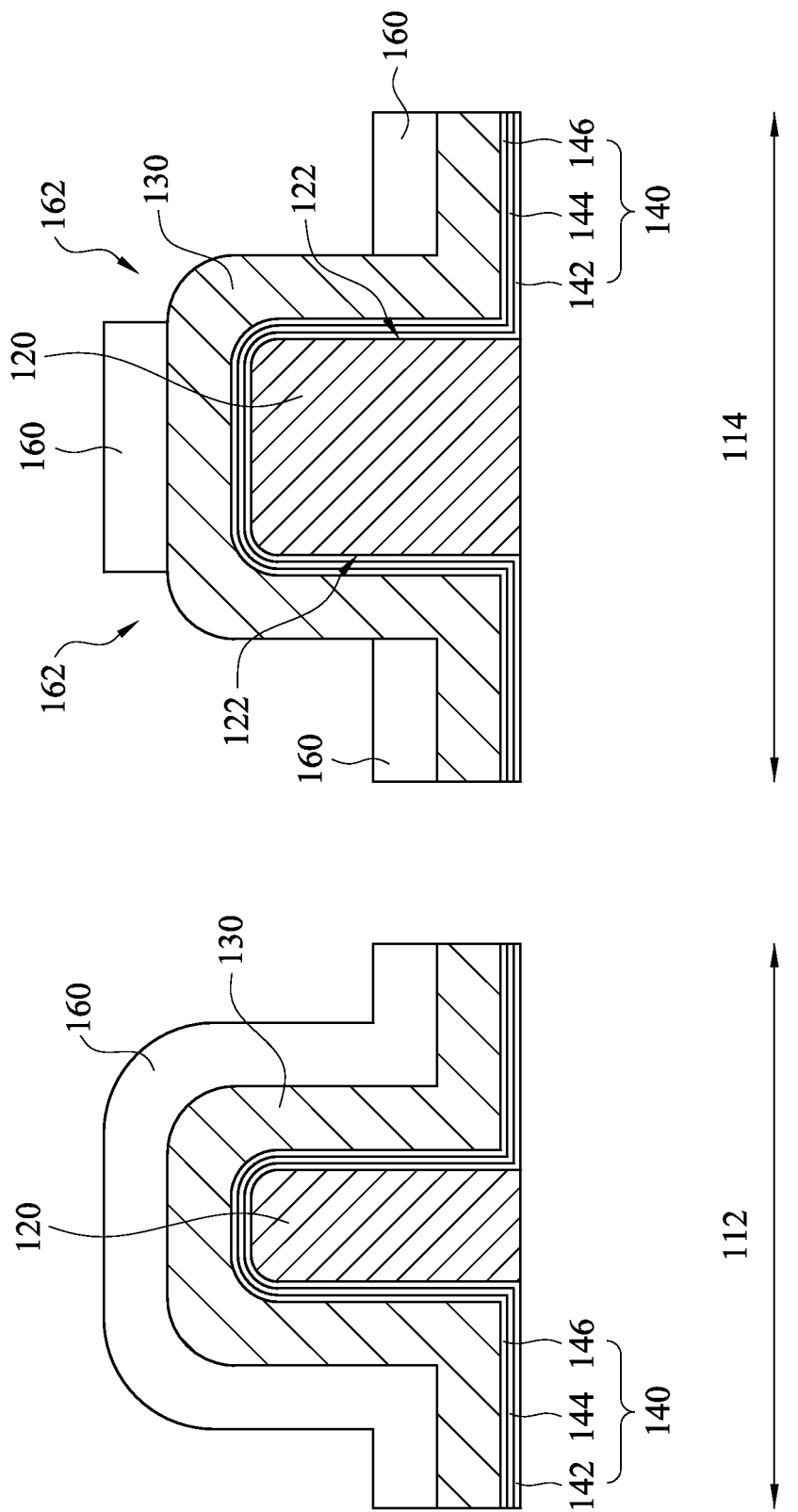
FIG. 6 is a schematic view of the portion of the flash memory semiconductor device shown in FIG. 5 in a subsequent stage of manufacture according to various embodiments of the present disclosure.
Figure 7:
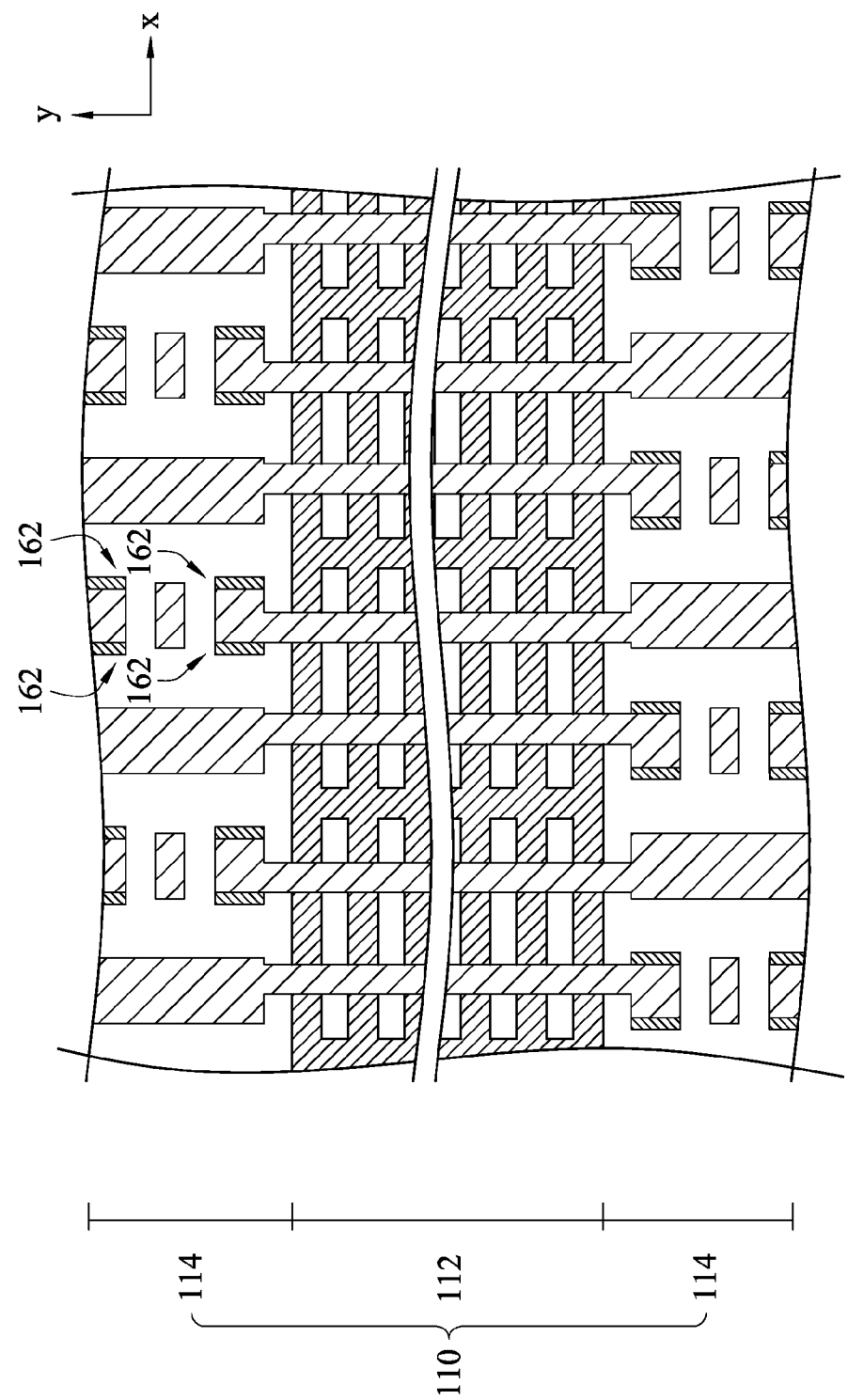
FIG. 7 illustrates schematic top-view of FIG. 6 according to some embodiments of the present disclosure.
Figure 8:
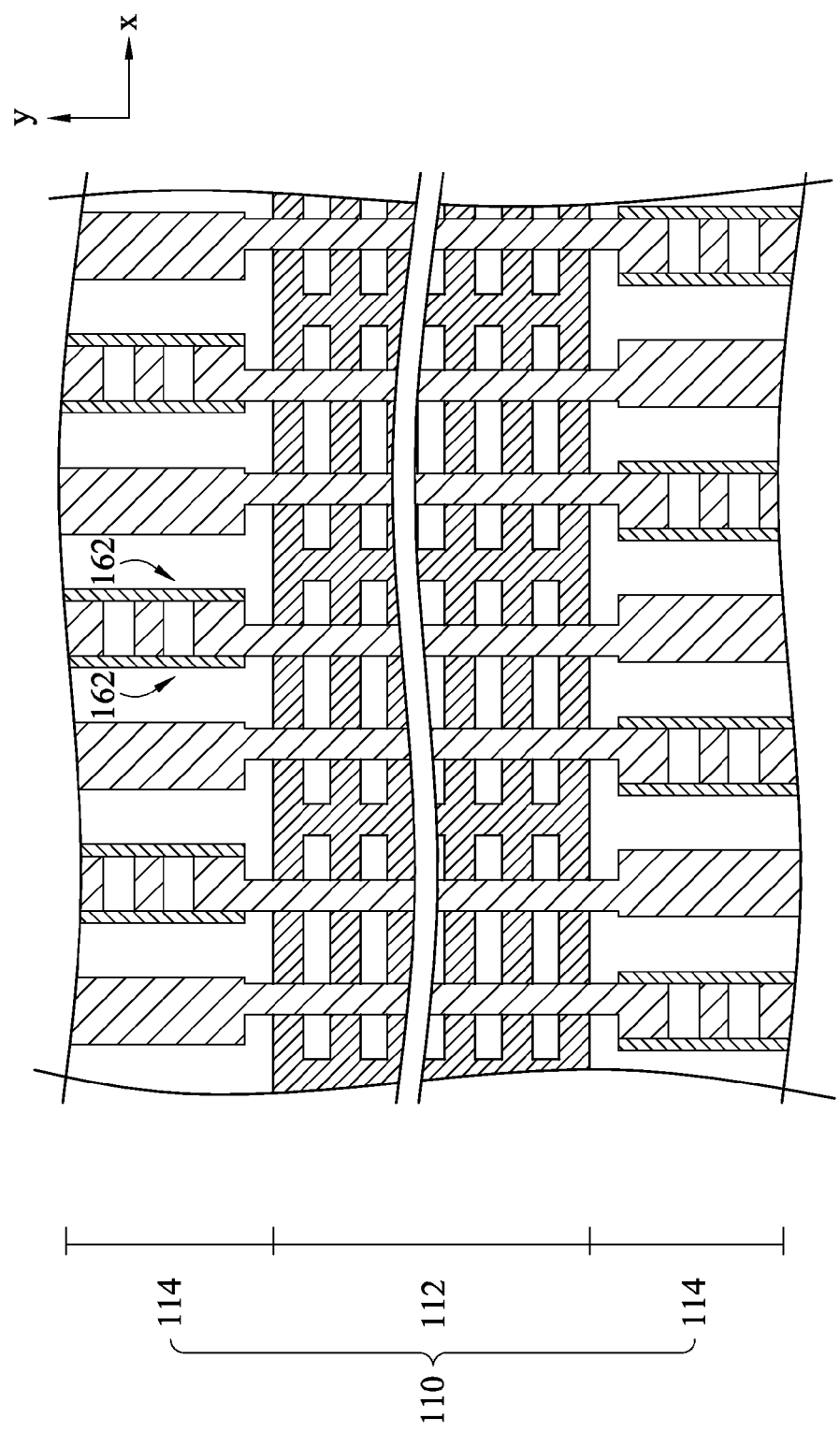
FIG. 8 illustrates schematic top-view of FIG. 6 according to some other embodiments of the present disclosure.

FIG. 6 is a schematic view of the portion of the flash memory semiconductor device shown in FIG. 5 in a subsequent stage of manufacture according to various embodiments of the present disclosure; FIG. 7 illustrates schematic top-view of FIG. 6 according to some embodiments of the present disclosure; and FIG. 8 illustrates schematic top-view of FIG. 6 according to some other embodiments of the present disclosure. When the operations of providing the semiconductor substrate 110, forming the control gate electrode 120 on the semiconductor substrate 110, depositing the dielectric film lamination 140, and depositing the conductive film 130 are completed, two recesses respectively corresponding to two sides 122 of the control gate electrode 120 on the shunt region 114 are formed. As illustrated in FIG. 6, in various embodiments of the present disclosure, forming two recesses of the conductive film 130 includes forming a mask pattern 160 on the conductive film 130. The mask pattern 160 has two openings 162 to respectively expose two parts of the conductive film 130 which are over two sides 122 of the control gate electrode 120 on the shunt region 114. As illustrated in FIG. 7, the length of the two openings 162 may be substantially equal to that of two sides 122 of the control gate electrode 120; or as illustrated in FIG. 8, the length of the two openings 162 may be substantially greater than that of two sides 122 of the control gate electrode 120. Next, the conductive film 130 is etched through the openings 162 to form two recesses of the conductive film 130. Therefore, two parts of the conductive film 130 the conductive film 130. In various embodiments of the present disclosure, etching the conductive film 130 through the openings 162 is performed by dry etching. After the etching process is completed, the mask pattern 160 is removed from the conductive film 130.

Figure 9:
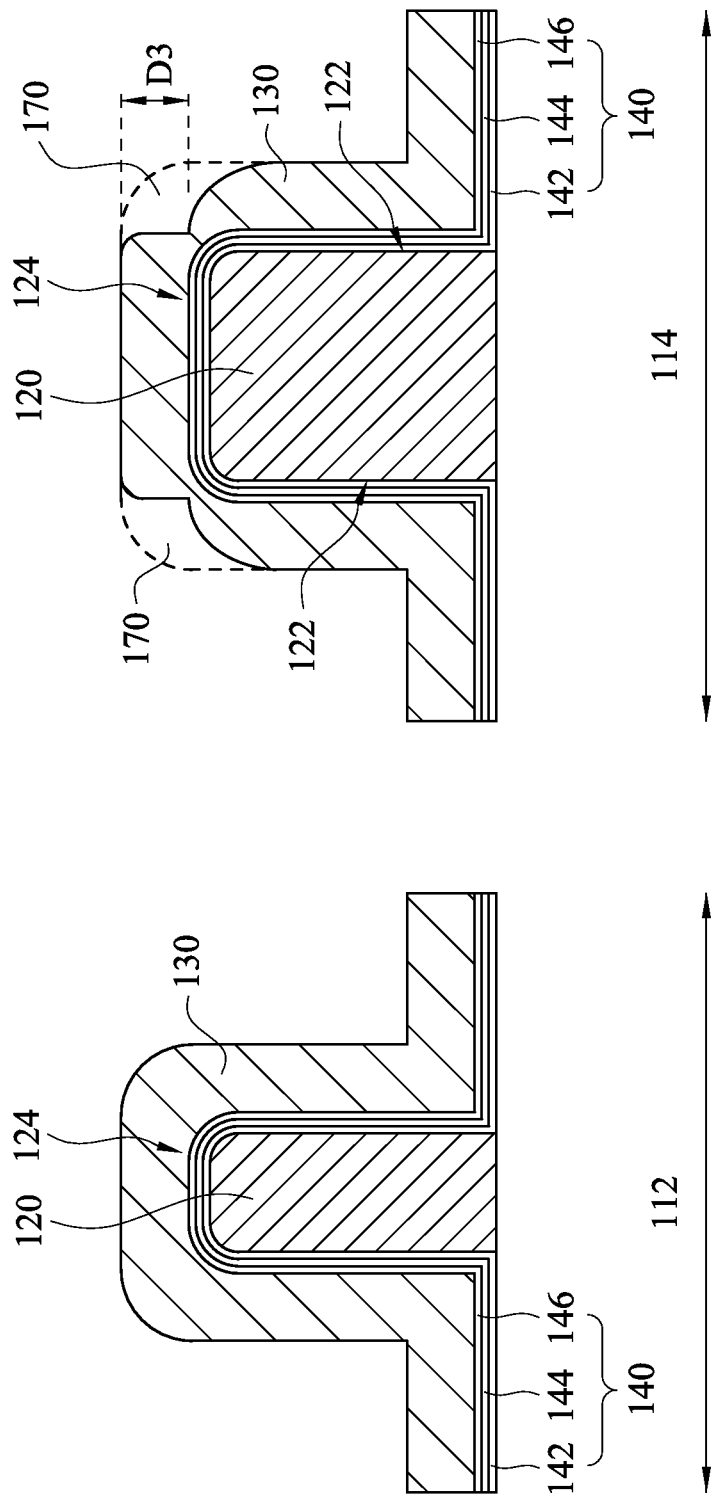
FIG. 9 is a schematic view of the portion of the flash memory semiconductor device shown in FIG. 6 in a subsequent stage of manufacture according to various embodiments of the present disclosure.

FIG. 9 is a schematic view of the portion of the flash memory semiconductor device shown in FIG. 6 in a subsequent stage of manufacture according to various embodiments of the present disclosure. As illustrated in FIG. 9, two recesses 170 respectively corresponding to two sides 122 of the control gate electrode 120 on the shunt region 114 are formed. It should be noticed that the recesses 170 are only formed above the control gate electrode 120 on the shunt region 114. The formation of recesses 170 can be regarded as a pre-etching process only performed on the conductive film 130 on the shunt region 114. As illustrated in FIG. 9, the recesses 170 are formed only on the shunt region 114, and not formed on the memory cell array region 112. The recesses 170 are formed respectively corresponding to two sides 122 of the control gate electrode 120 on the shunt region 114. As aforementioned and illustrated in FIG. 2 and FIG. 3, the distance between the top surface 124 of the control gate electrode 120 and the shunt sidewall memory gate electrode 134 will be substantially equal to the distance D1 between the top surface 124 of the control gate electrode 120 and the cell memory gate electrode 132 since the distances D1 and D2 are formed in the same process, and there is no optimized and common length of the distances D1 and D2 to avoid aforementioned issues. Therefore, as illustrated in FIG. 9, the pre-etching process only performed on the conductive film 130 on the shunt region 114 will produce greater depth from the top surface 124 of the control gate electrode 120 on the shunt region 114 than that on the memory cell array region 112 in the following steps. The depth D3 of the recesses 170 on the shunt region 114 may be optimized according to various requirements. In various embodiments of the present disclosure, the depth D3 of the recesses 170 is 5-30 nm.

Figure 10:
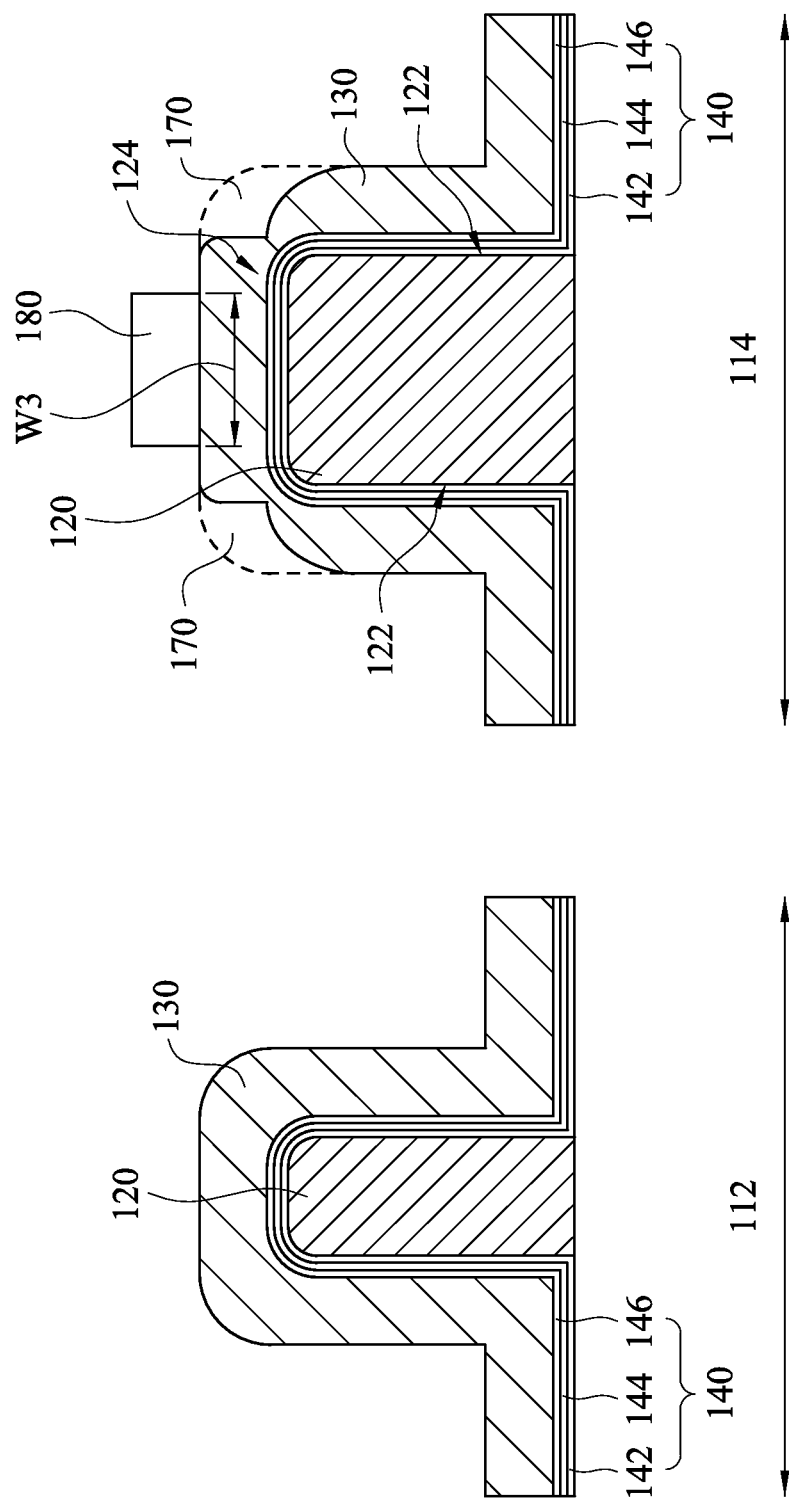
FIG. 10 is a schematic view of the portion of the flash memory semiconductor device shown in FIG. 9 in a subsequent stage of manufacture according to various embodiments of the present disclosure.
Figure 11:
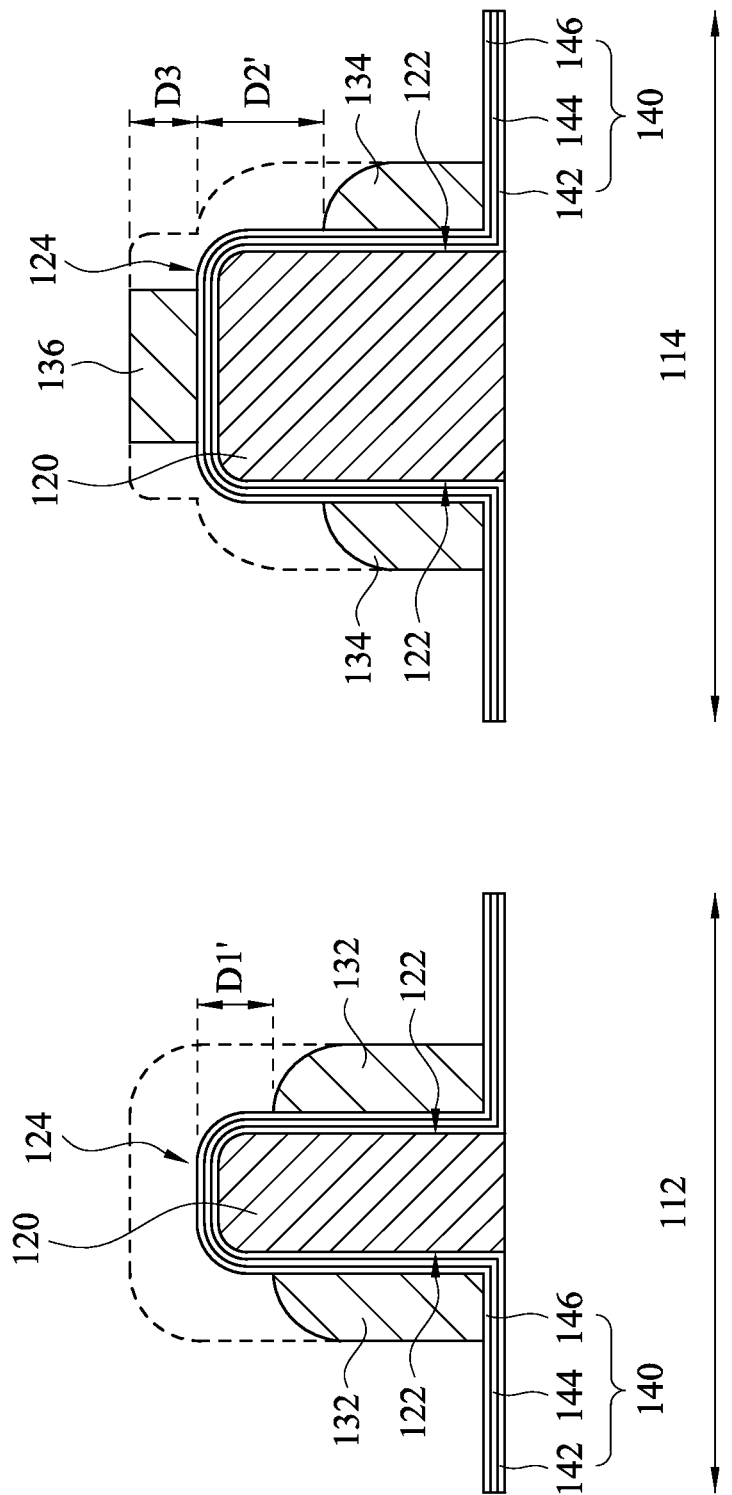
FIG. 11 is a schematic view of the portion of the flash memory semiconductor device shown in FIG. 10 in a subsequent stage of manufacture according to various embodiments of the present disclosure.

FIG. 10 is a schematic view of the portion of the flash memory semiconductor device shown in FIG. 9 in a subsequent stage of manufacture according to various embodiments of the present disclosure; FIG. 11 is a schematic view of the portion of the flash memory semiconductor device shown in FIG. 10 in a subsequent stage of manufacture according to various embodiments of the present disclosure. In various embodiments of the present disclosure, after forming two recesses 170 respectively corresponding to two sides 122 of the control gate electrode 120 on the shunt region 114 (as illustrated in FIG. 9), the conductive film 130 is patterned to form two sidewall memory gate electrodes 132, 134 and one top memory gate electrode 136 (as illustrated in FIG. 11). However, the present disclosure is not limited thereto. In other various embodiments of the present disclosure, forming two recesses 170 respectively corresponding to two sides 122 of the control gate electrode 120 on the shunt region 114 (as illustrated in FIG. 9) is performed after the conductive film 130 is patterned to form two sidewall memory gate electrodes 132, 134 and one top memory gate electrode 136 (as illustrated in FIG. 11). The sidewall memory gate electrodes 132 are respectively formed at two sidewalls 122 of the control gate electrode 120 on the memory cell array region 122; and the sidewall memory gate electrodes 134 are respectively formed at two sidewalls 122 of the control gate electrode 120 the shunt region 114, and the top memory gate 136 is formed above the control gate electrode 120 on the shunt region 114. Referring to FIG. 10 and FIG. 11, in various embodiments of the present disclosure, patterning the conductive film 120 includes forming a hard mask 180 to protect the conductive film 130 on the top surface 124 of the control gate electrode 120 on the shunt region 114 (as illustrated in FIG. 10), etching the conductive film 130 to form the sidewall memory gate electrodes 132, 134 and the top memory gate electrode 136, wherein the top memory gate 136 is formed between the hard mask 180 and the top surface 124 of the control gate electrode 120 on the shunt region 114, and removing the hard mask 180 on the top surface 124 of the control gate electrode 120 on the shunt region 114 (as illustrated in FIG. 11). The conductive film 130 may be etched by any anisotropy etching process. In various embodiments of the present disclosure, etching the conductive film 130 is performed by dry etching. As shown in FIG. 10 and FIG. 11, the conductive film 130 is etched anisotropically, and the sidewall memory gate electrodes 132 are respectively formed at two sidewalls 122 of the control gate electrode 120 on the memory cell array region 112, the sidewall memory gate electrodes 134 are respectively formed at two sidewalls 122 of the control gate electrode 120 the shunt region 114, and the top memory gate electrode 136 is formed above the control gate electrode 120 on the shunt region 114. The width W3 of the hard mask 180 illustrated in FIG. 10 may be properly design according to the predetermined width of the top memory gate electrode 136 illustrated in FIG. 11. As shown in FIG. 11, the distance D1' between the top surface 124 of the control gate electrode 120 and the sidewall memory gate electrodes 132 (on the memory cell array region 112) and the distance D2' between the top surface 124 of the control gate electrode 120 and the sidewall memory gate electrodes 134 (on shunt region 114) are both formed by etching the conductive film 130 in the present stage. It should be noticed that since the total etched amounts of the conductive film 130 on the memory cell array region 112 and the shunt region 114 is substantially the same since they are both formed in the same stage. Therefore, D2' will be greater than D1' because the depth D3 has been formed at previous recesses-forming step illustrated in FIG. 9. Accordingly, two different depths (from the top surface of the control gate electrode to the sidewall memory gate electrodes) of the structure of split-gates respectively on different regions (the memory cell array region 112 and the shunt region 114) can be fabricated, and aforementioned issues can be improved. In other words, D2' can be formed greater than D1' to avoid the risk of current-leakage problem of the structure of split-gates in the shunt region 114; D1' can be formed shorter than D2' to avoid the risk of process-charging problem of the structure of split-gates in the memory cell array region 112.

Figure 12:
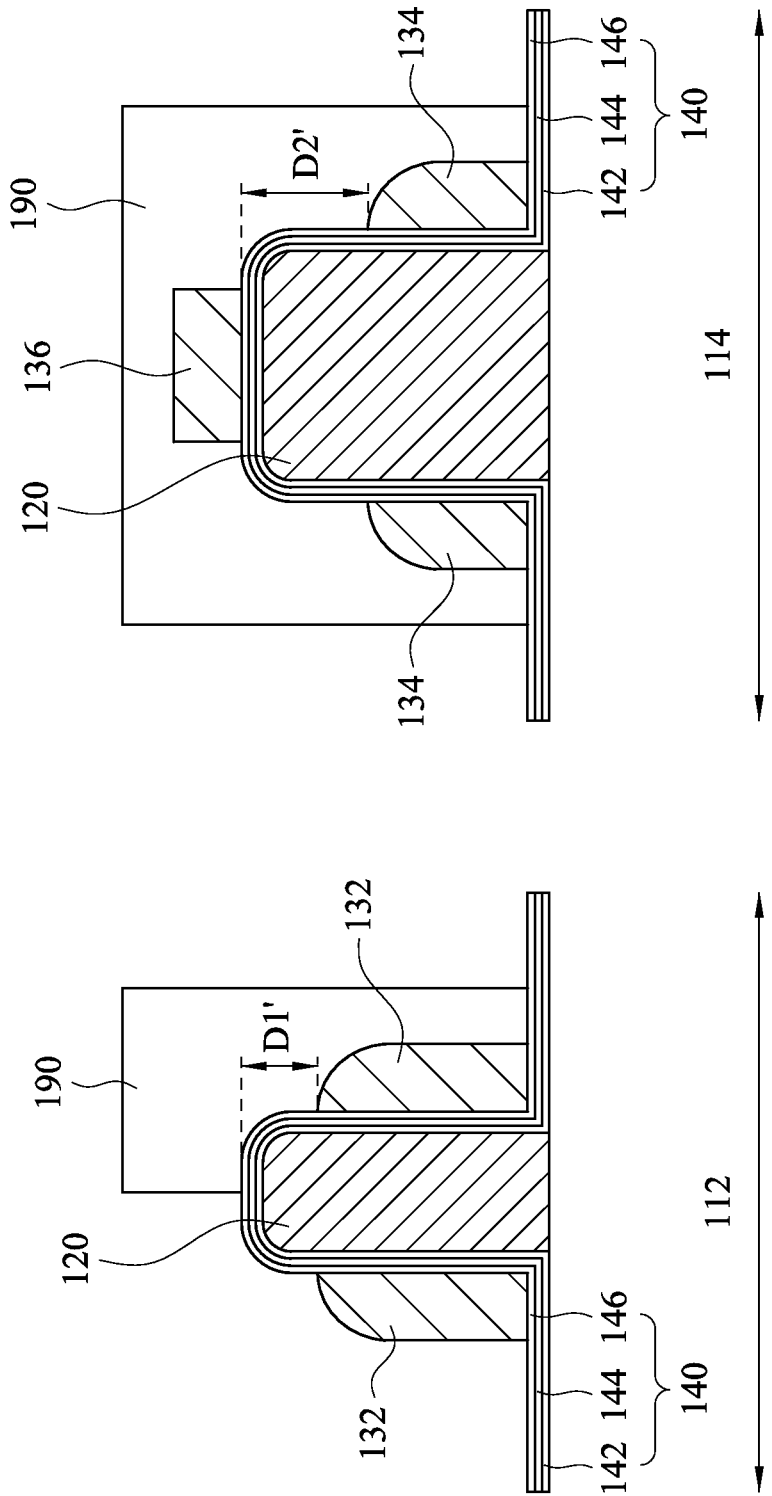
FIG. 12 is a schematic view of the portion of the flash memory semiconductor device shown in FIG. 11 in a subsequent stage of manufacture according to various embodiments of the present disclosure.
Figure 13:
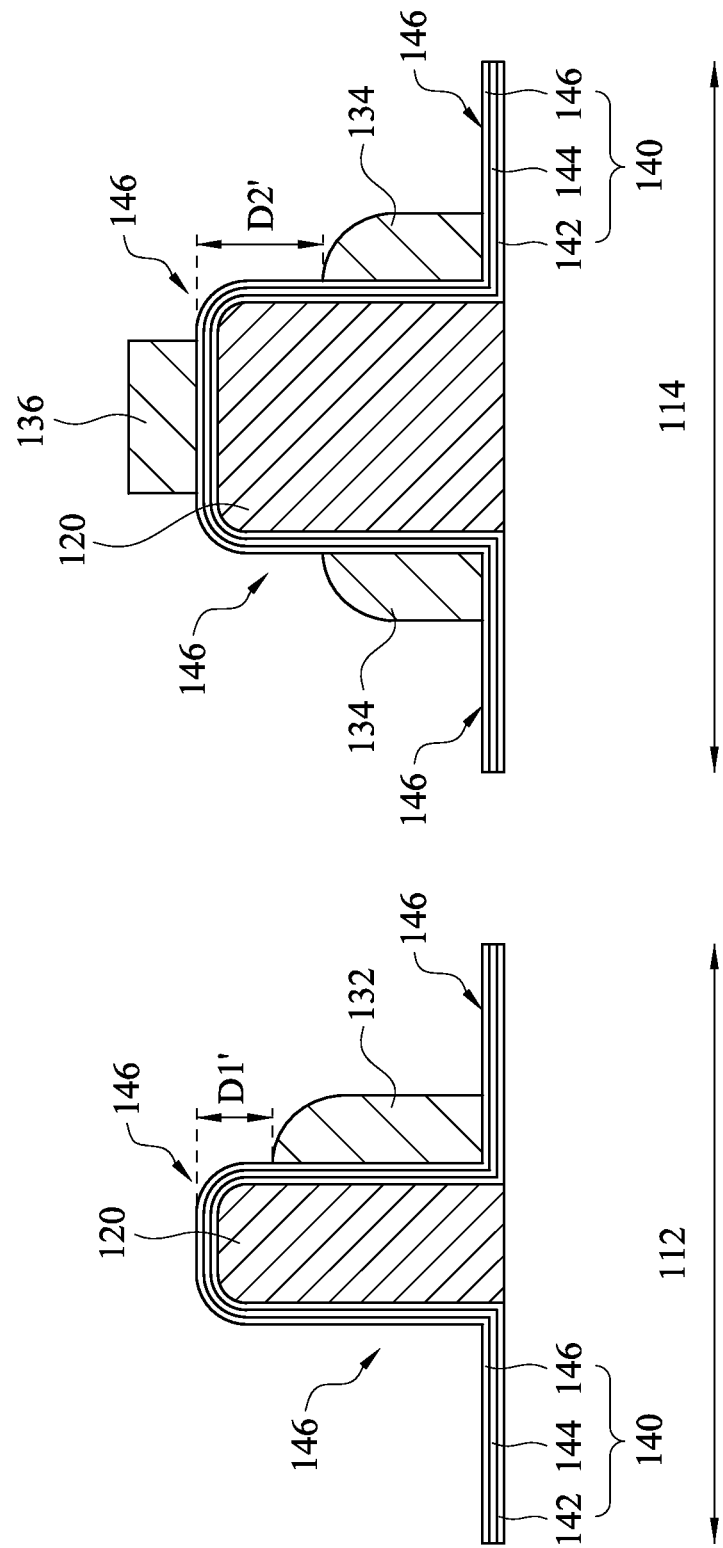
FIG. 13 is a schematic view of the portion of the flash memory semiconductor device shown in FIG. 12 in a subsequent stage of manufacture according to various embodiments of the present disclosure.

FIG. 12 is a schematic view of the portion of the flash memory semiconductor device shown in FIG. 11 in a subsequent stage of manufacture according to various embodiments of the present disclosure; FIG. 13 is a schematic view of the portion of the flash memory semiconductor device shown in FIG. 12 in a subsequent stage of manufacture according to various embodiments of the present disclosure. After patterning the conductive film 130 to form two sidewall memory gate electrodes 132, 134 and the top memory gate electrode 136, one of the sidewall memory gate electrodes 132 of the control gate electrode 120 on the memory cell array region 112 is removed. For example, as illustrate in FIG. 12, another mask pattern 190 is formed on the sidewall memory gate electrodes 134 and the top memory gate 136 on the shunt region 114, and one side of the sidewall memory gate electrodes 132 in the memory cell array region 112 to protect them. Dry-etching plasmas or wet-etching solutions may be applied to the other side of the sidewall memory gate electrodes 132 in the memory cell array region 112, which is not being protected, and removed it as shown in FIG. 13. After one of the sidewall memory gate electrodes 132 of the control gate electrode 120 on the memory cell array region 112 is removed, the dielectric film lamination 140 which is exposed from the sidewall memory gate electrodes 132, 134 and the top memory gate electrode 136 is removed. As illustrated in FIG. 13, the part 146 of the dielectric film lamination 140, which is not cover by the sidewall memory gate electrodes 132, 134 and the top memory gate electrode 136, is exposed, and removed by appropriate etching process. In various embodiments of the present disclosure, removing the dielectric film lamination is performed by wet etch.

Figure 14:
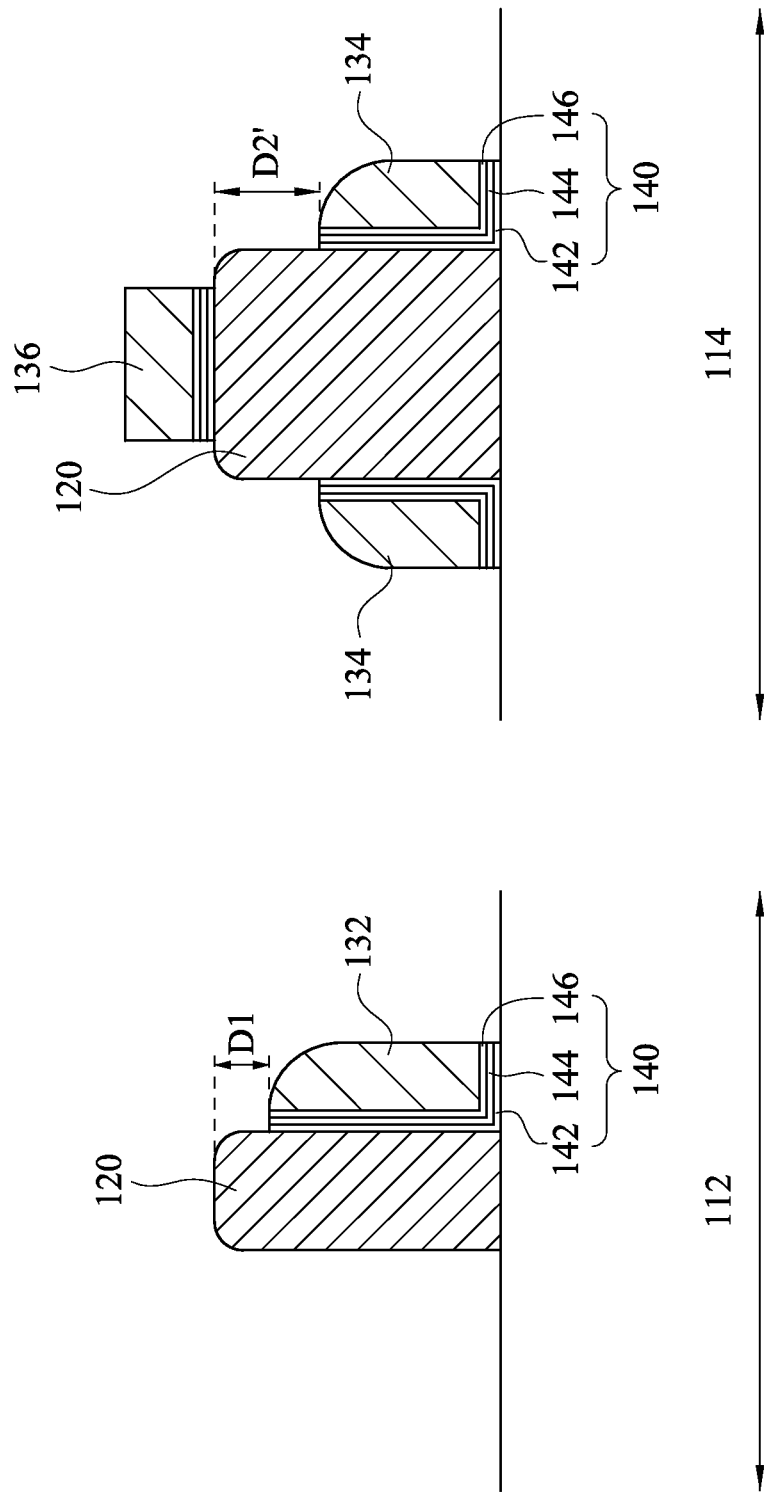
FIG. 14 is a schematic view of the portion of the flash memory semiconductor device shown in FIG. 13 in a subsequent stage of manufacture according to various embodiments of the present disclosure.

FIG. 14 is a schematic view of the portion of the flash memory semiconductor device shown in FIG. 13 in a subsequent stage of manufacture according to various embodiments of the present disclosure. As illustrated in FIG. 14, after the dielectric film lamination 140 which is exposed from the sidewall memory gate electrodes 132,134 and the top memory gate electrode 136 is removed. Two kinds of structures of split-gates are formed and respectively disposed on the memory cell array region 112 and the shunt region 114. As shown in FIG. 14, two different depths D1 and D2 (from the top surface of the control gate electrode to the sidewall memory gate electrodes) of the structures of split-gates respectively on different regions (the memory cell array region 112 and the shunt region 114) are fabricated, and aforementioned issues can be improved. In other words, D2 is formed greater than D1 to avoid the risk of current-leakage problem of the structure of split-gates in the shunt region 114; D1 is shorter than D2 to avoid the risk of process-charging problem of the structure of split-gates in the memory cell array region 112. In various embodiments of the present disclosure, the distance D2 between the top surface 124 of the control gate electrode 120 and the shunt sidewall memory gate electrode 134 is substantially 5-30 nm greater than the distance D1 between the top surface 124 of the control gate electrode 120 and the cell memory gate electrode 132. In various embodiments of the present disclosure, the distance D2 between the top surface 124 of the control gate electrode 120 and the shunt sidewall memory gate electrode 134 is substantially 60-75 nm, and the distance D1 between the top surface 124 of the control gate electrode 120 and the cell memory gate electrode 132 is substantially 45-55 nm.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of fabricating a flash memory semiconductor device, comprising:
   providing a semiconductor substrate having at least one memory cell array region and at least one shunt region adjacent to the memory cell array region;
   forming a control gate electrode on the semiconductor substrate, wherein the control gate electrode is formed on the memory cell array region and the shunt region;
   depositing a dielectric film lamination to cover the control gate electrode and the semiconductor substrate;
   depositing a conductive film to cover the dielectric film lamination;
   forming two recesses respectively corresponding to two sides of the control gate electrode on the shunt region;
   patterning the conductive film to form two sidewall memory gate electrodes and one top memory gate electrode, wherein the sidewall memory gate electrodes are respectively formed at two sidewalls of the control gate electrode on the memory cell array region and the shunt region, and the top memory gate electrode is formed above the control gate electrode on the shunt region;
   removing one of the sidewall memory gate electrodes on the memory cell array region; and
   removing the dielectric film lamination which is exposed from the sidewall memory gate electrodes and the top memory gate electrode.

2. The method of claim 1, wherein patterning the conductive film comprises:
   forming a hard mask on a top surface of the control gate electrode on the shunt region;
   etching the conductive film to form the sidewall memory gate electrodes and the top memory gate electrode, wherein the top memory gate electrode is formed between the hard mask and the top surface of the control gate electrode on the shunt region; and
   removing the hard mask on the top surface of the control gate electrode on the shunt region.

3. The method of claim 2, wherein etching the conductive film is performed by dry etching.

4. The method of claim 3, wherein etching the conductive film is performed by anisotropic etching.

5. The method of claim 2, wherein the distance between the top surface of the control gate electrodes and the shunt sidewall memory gate electrode is substantially 60-75 nm.

6. The method of claim 2, wherein patterning the conductive film comprises:
removing the exposed dielectric film lamination.

7. The method of claim 6, wherein removing the exposed dielectric film lamination is performed by wet etching.

8. The method of claim 1, wherein forming two recesses comprises:
forming a mask pattern on the conductive film, wherein the mask pattern has two openings to respectively expose two parts of the conductive film which are over two sides of the control gate electrode on the shunt region;
etching the conductive film through the openings to form two recesses of the conductive film; and
removing the mask pattern from the conductive film.

9. The method of claim 8, wherein the length of the two openings is substantially equal to the length of the two sides of the control gate electrode.

10. The method of claim 8, wherein the length of the two openings is substantially greater than the length of the two sides of the control gate electrode.

11. The method of claim 8, wherein the distance between the top surface of the control gate electrode and the cell memory gate electrode is substantially 45-55 nm.

12. The method of claim 8, wherein etching the conductive film through the openings is performed by dry etching.

13. The method of claim 8, wherein the depth of the recesses is 5-30 nm.

14. The method of claim 1, wherein depositing the dielectric film lamination comprises:
depositing a first silicon oxide film over the control gate electrode and the semiconductor substrate;
depositing a silicon nitride film over the first silicon oxide film; and
depositing a second silicon nitride film over the silicon nitride film.

15. The method of claim 1, wherein removing the dielectric film lamination is performed by wet etch.

16. The method of claim 1, wherein the control gate electrode comprises polysilicon.

17. The method of claim 1, wherein the conductive film electrode comprises polysilicon.

18. The method of claim 1, wherein the recess are respectively aligned above the control gate electrode on the shunt region.

19. The method of claim 1, wherein forming two recesses respectively corresponding to two sides of the control gate electrode on the shunt region is performed on the conductive film.

20. The method of claim 1, wherein forming the control gate electrode on the semiconductor substrate comprises:
forming a conductive film on the memory cell array region and the shunt region;
forming a photo resist mask on the conductive film to define the control gate electrode;
etching the conductive film; and
removing the photo resist mask.

* * * * *